(12) United States Patent
Hasper et al.

(10) Patent No.: US 7,674,726 B2
(45) Date of Patent: Mar. 9, 2010

(54) PARTS FOR DEPOSITION REACTORS

(75) Inventors: Albert Hasper, Meppel (NL);
Theodorus Gerardus Maria Oosterlaken, Oudewater (NL)

(73) Assignee: ASM International N.V. (NL)

( * ) Notice: Subject to any disclaimer, the term of this patent is extended or adjusted under 35 U.S.C. 154(b) by 888 days.

(21) Appl. No.: 11/250,795

(22) Filed: Oct. 13, 2005

(65) Prior Publication Data
US 2006/0084201 A1    Apr. 20, 2006

Related U.S. Application Data

(60) Provisional application No. 60/619,114, filed on Oct. 15, 2004.

(51) Int. Cl.
*H01L 21/31* (2006.01)
(52) U.S. Cl. ............... 438/785; 438/778; 257/E21.001
(58) Field of Classification Search ................ 438/778, 438/785; 257/E21.001
See application file for complete search history.

(56) References Cited

U.S. PATENT DOCUMENTS

| | | | |
|---|---|---|---|
| 4,262,631 A | 4/1981 | Kubacki | |
| 4,277,320 A | 7/1981 | Beguwala et al. | |
| 4,298,629 A | 11/1981 | Nozaki et al. | |
| 4,363,828 A | 12/1982 | Brodsky et al. | |
| 4,389,973 A | 6/1983 | Suntola et al. | |
| 4,495,218 A | 1/1985 | Azuma et al. | |
| 4,570,328 A | 2/1986 | Price et al. | |
| 4,585,671 A | 4/1986 | Kitagawa et al. | |
| 4,684,542 A | 8/1987 | Jasinski et al. | |
| 4,699,805 A | 10/1987 | Seelbach et al. | |
| 4,715,937 A | 12/1987 | Moslehi et al. | |
| 4,834,020 A | 5/1989 | Bartholomew | |

(Continued)

FOREIGN PATENT DOCUMENTS

EP    0442490 A1    8/1991

(Continued)

OTHER PUBLICATIONS

Hiltunen et al., "Nitrides of Titanium, Niobium, Tantalum and Molybdenum Grown as Thin Films by the Atomic Layer Epitaxy Method," Thin Solid Films, 166 (1988) 149-154.

(Continued)

*Primary Examiner*—Jack Chen
(74) *Attorney, Agent, or Firm*—Knobbe, Martens, Olson & Bear LLP

(57) ABSTRACT

Processing methods and internal reactor parts avoid peeling and particle generation caused by differences in the coefficients of thermal expansion (CTE's) between reactor parts and films deposited on the reactor parts in hot wall CVD chambers. Conventional materials for reactor parts have relatively low CTE's, resulting in significant CTE differences with modern films, which can be deposited on the surfaces of reactor parts during semiconductor processing. Such CTE differences can cause cracking and flaking of the deposited films, thereby leading to particle generation. Reactor parts, such as boats and pedestals, which undergo large thermal cycles even in a hot wall chamber, are made of materials having a CTE greater than about $5 \times 10^{-6}$ $K^{-1}$, in order to more closely match the CTE of deposited materials, such TiN. The decreased CTE differences decrease differences between the expansion and contraction of the reactor parts and deposited films, leading to decreased cracking, flaking and, ultimately, decreased particle generation.

9 Claims, 1 Drawing Sheet

Figure 1

U.S. PATENT DOCUMENTS

| | | | |
|---|---|---|---|
| 4,851,095 | A | 7/1989 | Scobey et al. |
| 4,935,661 | A | 6/1990 | Heinecke et al. |
| 5,227,329 | A | 7/1993 | Kobayashi et al. |
| 5,356,673 | A | 10/1994 | Schmitt et al. |
| 5,389,398 | A | 2/1995 | Suzuki et al. |
| 5,389,570 | A | 2/1995 | Shiozawa |
| 5,453,858 | A | 9/1995 | Yamazaki |
| 5,607,724 | A | 3/1997 | Beinglass et al. |
| 5,614,257 | A | 3/1997 | Beinglass et al. |
| 5,648,293 | A | 7/1997 | Hayama et al. |
| 5,656,531 | A | 8/1997 | Thakur et al. |
| 5,695,819 | A | 12/1997 | Beinglass et al. |
| 5,698,771 | A | 12/1997 | Shields et al. |
| 5,700,520 | A | 12/1997 | Beinglass et al. |
| 5,769,950 | A | 6/1998 | Takasu et al. |
| 5,786,027 | A | 7/1998 | Rolfson |
| 5,789,030 | A | 8/1998 | Rolfson |
| 5,837,580 | A | 11/1998 | Thakur et al. |
| 5,874,129 | A | 2/1999 | Beinglass et al. |
| 5,876,797 | A | 3/1999 | Beinglass et al. |
| 5,885,869 | A | 3/1999 | Turner et al. |
| 5,907,792 | A | 5/1999 | Droopad et al. |
| 5,916,365 | A | 6/1999 | Sherman |
| 6,015,590 | A | 1/2000 | Suntola et al. |
| 6,027,705 | A | 2/2000 | Kitsuno et al. |
| 6,083,810 | A | 7/2000 | Obeng et al. |
| 6,136,654 | A | 10/2000 | Kraft et al. |
| 6,159,828 | A | 12/2000 | Ping et al. |
| 6,171,662 | B1 | 1/2001 | Nakao |
| 6,197,669 | B1 | 3/2001 | Twu et al. |
| 6,197,694 | B1 | 3/2001 | Beinglass |
| 6,200,893 | B1 | 3/2001 | Sneh |
| 6,203,613 | B1 | 3/2001 | Gates et al. |
| 6,228,181 | B1 | 5/2001 | Yamamoto et al. |
| 6,326,311 | B1 | 12/2001 | Ueda et al. |
| 6,335,277 | B2 * | 1/2002 | Ohto ........................ 438/660 |
| 6,391,803 | B1 | 5/2002 | Kim et al. |
| 6,455,892 | B1 | 9/2002 | Okuno et al. |
| 6,468,924 | B2 | 10/2002 | Lee et al. |
| 6,528,530 | B2 | 3/2003 | Zeitlin et al. |
| 6,537,910 | B1 | 3/2003 | Burke et al. |
| 6,613,695 | B2 | 9/2003 | Pomarede et al. |
| 6,638,879 | B2 | 10/2003 | Hsich et al. |
| 2002/0098627 | A1 | 7/2002 | Pomarede et al. |
| 2002/0168868 | A1 | 11/2002 | Todd |
| 2002/0197831 | A1 | 12/2002 | Todd et al. |
| 2003/0022528 | A1 | 1/2003 | Todd |
| 2003/0082300 | A1 | 5/2003 | Todd et al. |
| 2003/0111013 | A1 | 6/2003 | Oosterlaken et al. |
| 2003/0148605 | A1 | 8/2003 | Shimogaki et al. |

FOREIGN PATENT DOCUMENTS

| | | | |
|---|---|---|---|
| EP | 0526779 | A1 | 2/1993 |
| JP | 59078919 | A | 1/1982 |
| JP | 57209810 | A | 12/1982 |
| JP | 59078918 | A | 5/1984 |
| JP | 60043485 | A | 3/1985 |
| JP | 61153277 | A | 7/1986 |
| JP | 62076612 | A | 4/1987 |
| JP | 63003414 | A | 1/1988 |
| JP | 63003463 | A | 1/1988 |
| JP | 1217956 | A | 8/1989 |
| JP | 1268064 | A | 10/1989 |
| JP | 2155225 | A | 6/1990 |
| JP | 3091239 | A | 4/1991 |
| JP | 3185817 | A | 8/1991 |
| JP | 3187215 | A | 8/1991 |
| JP | 3292741 | A | 12/1991 |
| JP | 4323834 | A | 11/1992 |
| JP | 5021378 | A | 1/1993 |
| JP | 5062911 | A | 3/1993 |
| JP | 7249618 | A | 9/1995 |
| JP | 8242006 | A | 9/1996 |

OTHER PUBLICATIONS

Hillman et al., "Properties of LPCVD TiN Barrier Layers," Microelectronic Engineering 19 (1992) 375-378.

Hiramatsu et al., Formation of TiN Films with Low Cl Concentration by Pulsed Plasma Chemical Vapor Deposition, J. Vac. Sci. Technol. A, 14(3) May/Jun. 1996.

Ikoma et al., Growth of Si/3C-SiC/Si(100) hetrostructures by pulsed supersonic free jets, Applied Physics Letters, vol. 75, No. 25, pp. 3977-3979, Dec. 1999.

Iyer, R. Suryanarayanan et al., "A Process Method of Silicon Nitride Atomic Layer Cyclic Deposition," Semicon Taiwan 2001, pp. 17-25.

Nakano et al., "Digital Chemical Vapor Deposition of $SiO_2$," Appl Phys. Lett. 57 (11) Sep. 1990, pp. 1096-1098.

Ramanuja, et al., "Synthesis and characterization of low pressure chemically vapor deposited titanium nitride films using $TiCl_4$ and $NH_3$," Materials Letters 57 (2002) 261-269.

Sakaue et al., Digital Chemical Vapor Deposition of $SiO_2$ Using a Repetitive Reaction of Triethylsilane/Hydrogen and Oxidation, Japanese Journal of Applied Materials, vol. 30, No. 1B, Jan. 1990, pp. L 124-L 127.

* cited by examiner

PARTS FOR DEPOSITION REACTORS

CROSS-REFERENCE TO RELATED APPLICATIONS

This application claims the priority benefit of U.S. Provisional Application No. 60/619,114, filed Oct. 15, 2004.

This application is also related to U.S. patent application Ser. No. 11/096,861, filed Mar. 31, 2005, the entire disclosure of which is incorporated herein by reference.

FIELD OF THE INVENTION

This invention relates generally to semiconductor fabrication and, more particularly, to thermal reactors for depositing films on substrates.

BACKGROUND OF THE INVENTION

Hot wall reactors can be used to deposit various materials on semiconductor substrates. The substrates can be accommodated in the process chamber of the reactors and precursors can be flowed into the process chamber to deposit films of material on the substrates. For a variety of reasons, including uniformity of electrical and physical properties, high purity and uniformity is typically desired for the deposited films. Deposition results, however, can be adversely affected by the presence of particulate matter in the furnace. In some cases, the particles can come to rest on or become incorporated into the films, thereby degrading the purity and uniformity of the deposited films.

A possible source of particulate matter contamination is material deposited on reactor surfaces. In the course of depositing films on substrates, material can be deposited on the surfaces of various reactor parts in the process chamber. This material can then flake off the reactor surfaces, thereby generating particulate matter that can contaminate deposited films.

Accordingly, to consistently achieve high quality process results, a need exists for processing methods and systems that can minimize the generation of particulate contaminants from reactor surfaces.

SUMMARY OF THE INVENTION

According to one aspect of the invention, a reactor is provided for semiconductor processing. The reactor comprises a hot wall reaction chamber and a heater configured to heat the reaction chamber. The reactor also comprises a controller configured to provide gases to the reaction chamber to deposit a film of material having a coefficient of thermal expansion (CTE) of $5 \times 10^{-6}$ $K^{-1}$ or greater. One or more reactor parts open to exposure to gases in the reaction chamber comprises a construction material having a CTE of $5 \times 10^{-6}$ $K^{-1}$ or greater.

According to another aspect of the invention, a chemical vapor deposition (CVD) reactor is provided. The reactor comprises a hot wall process chamber and gas sources in gas communication with the process chamber. The gas sources are suitable for CVD of a metal-containing material having a coefficient of thermal expansion (CTE) between about $4 \times 10^{-6}$ $K^{-1}$ and about $17 \times 10^{-6}$ $K^{-1}$. One or more parts of an exposed internal surface of the process chamber are formed of a reactor part material selected from the group consisting of the material sold under the trademark Macor®, boron nitride, ordinary glass, mullite, nickel, the metal alloy sold under the trademark Hastelloy®, stainless steels, high temperature steels, metal alloys sold under the trademark Iconel®, titanium and titanium alloys.

According to yet another aspect of the invention, a method is provided for semiconductor processing. The method comprises providing a semiconductor substrate in a hot wall process chamber of a reactor. The process chamber comprises a reactor part comprising a construction material having a CTE of about $5 \times 10^{-6}$ $K^{-1}$ or more. Process gases are flowed into the hot wall process chamber to deposit a film on the semiconductor substrate. The film has a coefficient of thermal expansion (CTE) of about $5 \times 10^{-6}$ $K^{-1}$ or more. The reactor part is subjected to thermal cycles with temperature swings of about 300° C. or greater.

According to yet another aspect of the invention, a method is provided for forming a reactor for depositing a film. The method comprises determining a coefficient of thermal expansion (CTE) of the film, wherein a CTE of the film is about $4 \times 10^{-6}$ $K^{-1}$ or higher. A construction material is selected for an internal reactor part based upon the CTE of the film, wherein a CTE of the construction material is within about 50% of the CTE of the film and wherein the construction material is different from silicon carbide. The internal reactor part is installed into a partially-constructed reactor.

According to another aspect of the invention, an interior semiconductor processing reactor part is provided. The part comprises a wall configured to form an exposed internal surface of a process chamber of a hot wall reactor. The wall comprises a material having a coefficient of thermal expansion (CTE) about $5 \times 10^{-6}$ $K^{-1}$ or higher.

It will be appreciated that, preferably, the coefficient of thermal expansion of the construction materials is between $4 \times 10^{-6}$ $K^{-1}$ and $17 \times 10^{-6}$ $K^{-1}$, more preferably between about $5 \times 10^{-6}$ $K^{-1}$ and about $15 \times 10^{-6}$ $K^{-1}$. For systems depositing metal and metal compound materials with a CTE between about $4 \times 10^{-6}$ $K^{-1}$ and $6 \times 10^{-6}$ $K^{-1}$, the construction materials preferably have a CTE between about $4 \times 10^{-6}$ $K^{-1}$ and $9 \times 10^{-6}$ $K^{-1}$. For systems depositing metal and metal compound materials with a CTE greater than $6 \times 10^{-6}$ $K^{-1}$, the construction materials preferably have a CTE between about $7 \times 10^{-6}$ $K^{-1}$ and $12 \times 10^{-6}$ $K^{-1}$, including, e.g., the metal and metal alloys of Table 4 below.

BRIEF DESCRIPTION OF THE DRAWINGS

The invention will be better understood from the detailed description of the preferred embodiments and from the appended drawing, which is meant to illustrate and not to limit the invention and wherein.

DETAILED DESCRIPTION OF THE PREFERRED EMBODIMENTS

Figure 1:
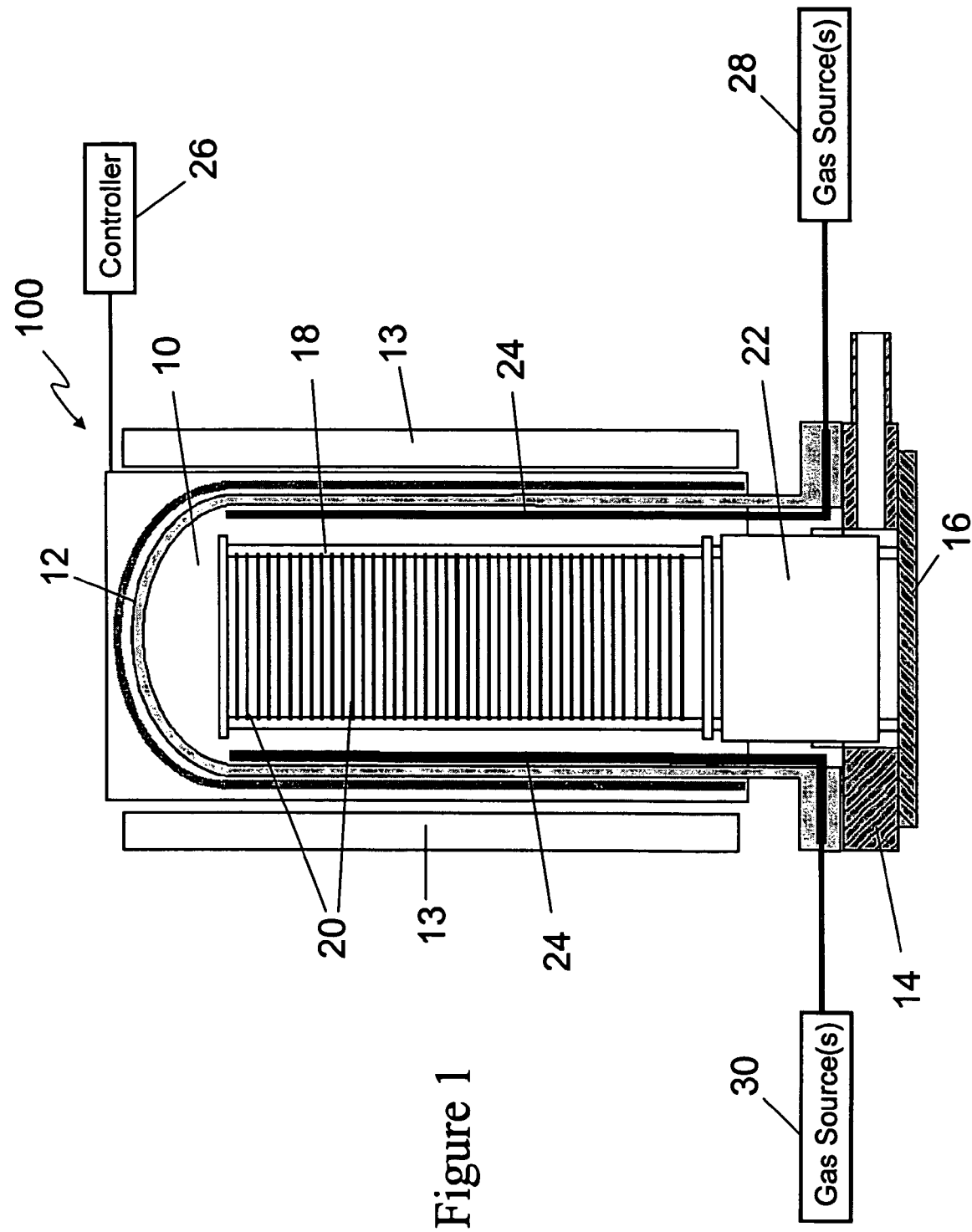
FIG. 1 illustrates an exemplary hot wall deposition reactor for use with preferred embodiments of the invention.

It has been found that excessively high levels of particle generation can occur during the deposition of film materials, especially some modern, newly-used film materials. These high levels of particle generation have been found to be caused by mismatches in the coefficients of thermal expansion (CTE's) between reactor parts and films that are deposited on the reactor parts. For example, when a deposited film expands at a different rate than an underlying reactor part, the films can crack and encourage the flaking of deposited material off of the reactor part. This cracking and flaking increases the particle count in a process chamber and can cause the deposited films to become contaminated with the flaked off material. The cracking and flaking has been found to be exacerbated in newer films, especially those more recently found to be suitable for formation by chemical vapor deposition in hot-wall reactors, because differences in CTE's between reactor parts and the deposited films has increased, due to increasing CTE's for the deposited films and to relatively low CTE's for the reactor parts.

It will be appreciated that, conventionally, films deposited during semiconductor processing have included silicon oxide, silicon nitride, polycrystalline silicon and epitaxial silicon films. Deposition of these films by Chemical Vapor Deposition (CVD) techniques, such as Low Pressure CVD, is typically conducted in thermal reactors made of quartz, because quartz is highly resistant to high temperature processing and is available as a very pure material. Quartz has a relatively low Coefficient of Thermal Expansion (CTE) of $0.59 \times 10^{-6}$ K$^{-1}$. Although the CTE of the deposited materials can be higher (e.g., CTE of $Si_3N_4 = 3 \times 10^{-6}$ K$^{-1}$, CTE of $Si = 2.3 \times 10^{-6}$ K$^{-1}$; see also Table 1) than that of quartz, the differences in CTE between quartz and the deposited materials are relatively small, at about $2.41 \times 10^{-6}$ K$^{-1}$ for $Si_3N_4$ and $1.71 \times 10^{-6}$ K$^{-1}$ for Si. Some reactor parts can also be formed of SiC and, depending on the deposited material, the CTE's of SiC reactor parts (CTE of SiC=$4 \times 10^{-6}$ K$^{-1}$) can provide a better match with the CTE's of some deposited films. Various conventional reactor part materials (quartz and silicon carbide) and conventional film materials (silicon nitride, silicon, and tungsten) are listed in Table I below.

When conventional films such as these are deposited onto reactor parts made of quartz, they typically remain very well adhered to the reactor parts even when the reactor parts go through numerous large thermal cycles. An example of such a large thermal cycle is the cycling of a wafer boat every process run between room temperature and process temperature. Thus, particle generation during the deposition of conventional film materals in reactors formed with conventional reactor materials has typically not been particularly problematic.

TABLE 1

Coefficient of Thermal Expansion (CTE) of Conventional Reactor Part Materials and Film Materials Used in Semiconductor Processing

| Material | Thermal expansion (ppm/K) |
|---|---|
| Quartz | 0.59 |
| Silicon nitride | 3 |
| Silicon | 2.3 |
| Silicon carbide | 4.0 |
| Tungsten | 4.5 |

Reactor part materials such as those discussed above, however, have been found to cause undesirably high levels of particulate contamination during the deposition of some film materials which have been newly found to be suitable for deposition in hot wall reactors. In addition to more conventional deposited films, such as silicon oxide, silicon nitride, polycrystalline silicon and epitaxial silicon films, that are deposited in conventional hot wall reactors, other types of films have recently been considered for use in semiconductor processing or are already in use and that have been found to be suitable for deposition in conventional hot wall reactors. Among these more modern films are metal films and metal compound films, formed from metals and transition metals such as Al, Ti, Zr, Hf, V, Nb, Ta, Cr, Mo, W, Re, Ru, Rh, and Cu. Examples of metal compound films include oxides, nitrides and carbides of the above-listed metals, and mixtures of such compounds. The CTE of these metal containing materials is significantly higher than that of the more conventional silicon and silicon compound films discussed above. Table 2 lists values for the CTE's of a number of exemplary, relatively new semiconductor processing materials.

TABLE 2

Coefficient of Thermal Expansion (CTE) for New Metals and Metal Compound Materials Deposited During Semiconductor Processing

| Material | Thermal expansion (ppm/K) |
|---|---|
| Titanium Nitride (TiN) | 9.3 |
| Tantalum Nitride (TaN) | 6 |
| Zirconia, Yttrium stabilized zirconia ($ZrO_2$, Yt|$ZrO_2$) | 8-11 |
| Aluminum oxide ($Al_2O_3$) | 8.1 |
| Hafnium Oxide ($HfO_2$) | 5.6 |
| Titanium (III) Oxide ($TiO_2$) | 9.2 |
| Tantalum Oxide ($TaO_5$) | 5 |
| Copper (Cu) | 16.6 |
| Ruthenium (Ru) | 5.1-9.6 |

Although many of these newer materials have conventionally been deposited by various alternative techniques at relatively low temperatures, it now appears that these materials can also be deposited in more conventional hot wall thermal reactors. For example, CVD of TiN films in a conventional hot wall vertical furnace has been found to be possible. Such a process is described in co-pending and co-owned U.S. patent application Ser. No. 11/096,861, filed Mar. 31, 2005, the entire disclosure of which is incorporated herein by reference. It has been found that good uniformities and film properties can be achieved by such methods.

However, the thermal expansion coefficient of a TiN film (CTE=$9.3 \times 10^{-6}$ K$^{-1}$) differs significantly from the thermal expansion coefficient of materials, such as quartz, that are typically used in vertical furnaces and other hot wall reactors. The mismatch in expansion coefficients between TiN and conventional reactor part materials has been found to give rise to cracking of TiN films and flaking off of the films from reactor parts. Reactor parts that frequently go through large temperature cycles raise particular problems. Wafer boats, for example, often cycle between process temperatures and room temperature during each run. The cracking and flaking of the TiN films give rise to high particle counts, which is undesirable and can cause contamination of deposited films.

Advantageously, preferred embodiments of the invention provide for apparatus and methods of processing which minimize particle generation. It has been found that reactor parts that are formed with materials having relatively high CTE's advantageously generate fewer particles during the deposition of newer film materials. The reactor parts are preferably internal to a process chamber, are exposed to process gases and/or are subject to thermal cycling. Preferably, the deposited material has a CTE between about $4 \times 10^{-6}$ K$^{-1}$ and about $17 \times 10^{-6}$ K$^{-1}$ CTE and the CTE of material used for the reactor parts is within about 50%, more preferably, within about 30% of the CTE of the deposited material and the material used for the reactor parts is preferably also not SiC. In some preferred embodiments, the CTE of the reactor part material is about $5 \times 10^{-6}$ K$^{-1}$ or higher, which has been found to provide good levels of particle generation with many newer materials. Thus, many newer materials can be deposited with minimal particle generation in process chambers having parts formed of these materials. Moreover, materials provided herein have good heat resistance and are suitable for use in semiconductor processing at elevated temperatures.

Without being limited by theory, because the CTE's of the reactor part materials disclosed herein are closer to the CTE's of many newer deposited films, the expansion and contraction of the materials as a function of temperature is similar. Thus, cracking and flaking of the films is decreased. Moreover, a greater thickness of the films can be deposited before the reactor part requires cleaning, which is an economical advantage. Thus, advantageously, high quality process results are achieved and reactor maintenance, such as cleaning, is decreased.

Reference will now be made to the Figure. It will be appreciated that the Figure is not necessarily drawn to scale.

FIG. 1 illustrates an exemplary hot wall batch reactor 100 for the deposition of films during semiconductor manufacturing. Such a batch reactor is commercially available under the trade name A412™ from ASM International N.V. of Bilthoven, The Netherlands. The illustrated reactor is a vertical furnace type of reactor, which has benefits for efficient heating and loading sequences, but the skilled artisan will appreciate that the principles and advantages disclosed herein will also have application to other types of reactors.

With continued reference to FIG. 1, a reaction chamber 10 is delimited by a process tube 12 and, at a lower end, by a flange 14 that supports the process tube 12 and a door plate 16. The process tube 12 is surrounded by a heater 13. A wafer boat 18 is positioned within the reaction chamber 10 when the door plate 16 is raised. The wafer boat 18 holds a plurality of substrates 20, e.g., wafers. Preferably, the wafer boat 18 holds 50 or more wafers 20. The wafer boat 18 rests on a pedestal 22 that is in turn supported by the door plate 16. In the illustrated example, vertically extending injectors 24 feed gases from gas sources 28 and 30 into the chamber 10. The gas sources 28 and 30 can contain the same or different precursors. In some embodiments, the injectors 24 are connected to the same gas source, represented by 28 and 30. In other embodiments, the gas sources 28 and 30 can each provide a plurality of precursors, from a plurality of containers. The reactor 100 can be provided with a controller 26 configured or programmed to regulate precursor flow from the gas sources 28 and 30 into the chamber 10 to deposit films on the wafers 20.

The reactor 100 is preferably configured for deposition of a metallic material, such as the materials listed in Table 2 above, or metals and metal compounds (e.g., oxides, nitrides, carbides, mixtures) including one or more of Al, Ti, Zr, Hf, V, Nb, Ta, Cr, Mo, W, Re, Ru, Rh, and Cu. As can be seen from Table 2 above, these materials tend to have CTE's ranging from about $5 \times 10^{-6}$ $K^{-1}$ to about $17 \times 10^{-6}$ $K^{-1}$. These values are considerably higher than the CTE's typical for materials, such as quartz, silicon nitride and silicon carbide, used to form internal reactor parts. It will be appreciated that the internal reactor parts have exposed surfaces in the chamber 10, that is, the internal reactor parts have surfaces that are exposed to process gases during processing.

Preferably, films are deposited on substrates 20 by chemical vapor deposition (CVD). For the purpose of this disclosure, CVD is considered to comprise all variations know in the art, including but not limited to Atmospheric Pressure CVD, Low Pressure CVD, Plasma Assisted CVD, Radical Assisted CVD, Pulsed CVD, and Atomic Layer Deposition. Accordingly, as will be understood by the skilled artisan, the injectors 24 fluidly communicate with sources of precursors suitable for deposition of the aforementioned materials. The controller 26 regulates the flow of precursors or reactants through the injectors 24. Additionally, a processor, e.g., in the controller 26, is programmed to provide control over deposition conditions, including robotic movements for loading/ unloading wafers 20 into or from the boat 18; loading and unloading the boat into or from the process tube 12; setting and controlling process temperatures; etc.

Internal reactor parts such as the process tube 12, the flange 14, the door plate 16, the pedestal 22, the wafer boat 18 and the injectors 24 are all typically exposed to process gases. As known in the art, additional internal reactor parts such as a liner, a thermocouple with a sheath around it etc. (not shown), may be present and may be similarly exposed to process gases. Accordingly, films will be deposited onto these various internal reactor parts. To minimize cracking and flaking of these films, one or more of these parts preferably comprises a material having a CTE of $5 \times 10^{-6}$ $K^{-1}$ or higher. Examples of suitable ceramic construction materials with such higher CTE's are listed in Table 3, and examples of metal and metal alloy construction materials with such higher CTE's are listed in Table 4.

TABLE 3

Coefficient of Thermal Expansion (CTE) of Ceramic Construction Materials for Reactor Parts

| Material | Thermal expansion (ppm/K) |
|---|---|
| Macor ® | 12.6 |
| Boron Nitride | 11.9 |
| Glass, ordinary | 9 |
| Mullite | 5.4 |

TABLE 4

Coefficient of Thermal Expansion (CTE) of Metals and Metal Alloys Construction Materials for Reactor Parts

| Material | Thermal expansion (ppm/K) |
|---|---|
| Nickel | 13 |
| Hastelloy ® | 11.9 |
| Stainless steel 430 | 11.8 |
| High temperature steels | 11 |
| Iconel ® 600 | 10.4 |
| Titanium | 8.5 |

It is particularly beneficial for parts subject to large temperature swings (e.g., swings of greater than about $\Delta T=100°$ C., more particularly, swings greater than about $\Delta T=300°$ C.) and/or frequent temperature swings (e.g., every wafer load, as opposed to every production run) to include or be made of a material with a CTE that is greater than about $5 \times 10^{-6}$ $K^{-1}$. For example, it is particularly advantageous for the wafer boat and the pedestal to comprise a material having a CTE of $5 \times 10^{-6}$ $K^{-1}$ or higher, because these parts cycle between room temperature and process temperature during each batch process and, thus, are most susceptible to the expansion and contraction that can cause cracking and flaking when there are large differences between the CTE's of reactor part materials and deposited materials. Although the door plate is also subjected to thermal cycling, its temperature during processing tends to remain relatively low, since it is isolated from the hot zone of the furnace by the pedestal and, in addition, in typical reactor designs, only a limited amount of material deposits on it.

Preferably, in some embodiments, the deposited material has a CTE between about $4 \times 10^{-6}$ $K^{-1}$ and about $17 \times 10^{-6}$ $K^{-1}$, or between about $5 \times 10^{-6}$ $K^{-1}$ and about $15 \times 10^{-6}$ $K^{-1}$, and the internal reactor parts (those reactor parts exposed to deposition gases) comprise materials with CTE's that are within about 50%, more preferably, within about 30% and, most preferably, within about 20% of the CTE of the deposited material. For example, the CTE's of the reactor part materials are between about $4\times10^{-6}$ $K^{-1}$ and about $17\times10^{-6}$ $K^{-1}$, more preferably between about $5\times10^{-6}$ $K^{-1}$ and about $15\times10^{-6}$ $K^{-1}$. For systems depositing metal and metal compound materials with a CTE between about $4\times10^{-6}$ $K^{-1}$ and about $6\times10^{-6}$ $K^{-1}$, such as TaN, $HfO_2$ and $TaO_5$, the construction materials preferably have a CTE between about $4\times10^{-6}$ $K^{-1}$ and about $9\times10^{-6}$ $K^{-1}$, including, e.g., SiC and Ti. For systems depositing metal and metal compound materials with a CTE greater than $6\times10^{-6}$ $K^{-1}$, the construction materials preferably have a CTE between about $7\times10^{-6}$ $K^{-1}$ and about $12\times10^{-6}$ $K^{-1}$. Examples of such materials include, e.g., the metal and metal alloys of Table 4 above. In other examples, in a vertical furnace configured for CVD of TiN, suitable construction materials for the boat and pedestal include boron nitride, ordinary glass, Hastelloy®, stainless steel 430, high temperature steels, Iconel® 600 and titanium.

Common process temperatures for depositing the metals and metal compounds used in semiconductors are typically between about 100° C. and about 600° C., and, more specifically, can be between about 300° C. and about 500° C. Advantageously, the metals and metal alloys listed in Table 4 are able to withstand these temperatures easily.

Preferably, when reactor parts are made of metals or metal alloys such as provided in Table 4, after machining and before use in the reactor, the parts are preferably cleaned and subjected to a homogeneous surface roughening treatment such as sandblasting. Advantageously, the roughening allows for an improved adherence of the deposited films onto the surface of the reactor parts.

It will be appreciated that some reactor parts can be subject to higher levels of deposition from process precursors or reactants than other reactor parts. In addition, particular portions of some reactor parts can be subject to higher levels of deposition than other portions of the reactor parts. Preferably, at least the reactor parts, or portions of the reactor parts, most subject to deposition are made from one or more materials having high CTE'S, such as those listed in Tables 3 or 4. In other embodiments, the entire reactor part is not made of the high CTE material; rather, the portions of the parts, such as boats and pedestals, that are most subject to being coated by a deposited film are made from one or more of the high CTE materials. While the entire part need not be made of a high CTE material, the portions of the parts comprising the high CTE material are preferably formed of the material, rather than simply being formed of a low CTE material that is coated with the high CTE material. It will be appreciated that such coatings can be disadvantageous, since they can be subject to the same thermal stresses that cause peeling of deposited films on the equipment. Rather, it will be understood that benefits will be obtained from use of construction materials that have CTEs closer to the CTE to the deposited film, relative to quartz and other conventional materials listed in Table 1.

It will be appreciated by those skilled in the art that various other omissions, additions and modifications may be made to the methods and structures described above without departing from the scope of the invention. All such modifications and changes are intended to fall within the scope of the invention, as defined by the appended claims.

We claim:

1. A method of semiconductor processing, comprising:
    providing a semiconductor substrate in a hot wall process chamber of a reactor, the process chamber comprising a reactor part comprising a construction material having a CTE of about $5\times10^{-6}K^1$ to about $15\times10^{-6}$ $K^{-1}$;
    flowing process gases into the hot wall process chamber to deposit a film on the semiconductor substrate, wherein the film has a coefficient of thermal expansion (CTE) of about $5\times10^{-6}$ $K^{-1}$ to about $15\times10^{-6}$ $K^{-1}$, wherein a deposition temperature to deposit the film on the substrate is between about 100° C. and about 600° C.; and
    subjecting the reactor part to thermal cycles with temperature swings of about 300° C. or greater, wherein the thermal cycles comprise heating the reactor part to the deposition temperature inside the process chamber.

2. The method of claim 1, wherein flowing process gases comprises performing a chemical vapor deposition.

3. The method of claim 1, wherein flowing process gases comprises flowing precursors containing one or more elements selected from the group consisting of Al, Zr, Hf, V, Nb, Ta, Cr, Mo, W, Re, Ru, Rh, and Cu.

4. The method of claim 3, wherein the deposited film is formed of a material selected from the group consisting of TaN, $ZrO_2$, Yt|$ZrO_2$, $HfO_2$, $Al_2O_3$, $TiO_2$, $TaO_5$, Cu and Ru.

5. The method of claim 1, wherein flowing process gases comprises depositing a TiN film.

6. The method of claim 1 wherein an internal reactor part is formed entirely of the construction material.

7. The method of claim 1 wherein the construction material defines a portion of a wall delimiting the hot wall process chamber.

8. The method of claim 1, wherein the reactor is a vertical batch reactor.

9. The method of 8, wherein the reactor is configured to accommodate 50 or more substrates.

* * * * *

UNITED STATES PATENT AND TRADEMARK OFFICE
CERTIFICATE OF CORRECTION

| | | |
|---|---|---|
| PATENT NO. | : 7,674,726 B2 | Page 1 of 1 |
| APPLICATION NO. | : 11/250795 | |
| DATED | : March 9, 2010 | |
| INVENTOR(S) | : Hasper et al. | |

It is certified that error appears in the above-identified patent and that said Letters Patent is hereby corrected as shown below:

In Title Page 1, Col. 1, line 15, after "such" please insert --as--.

In Title Page 2, Col. 2, line 32, under "Other Publications," please change "hetrostructures" to --heterostructures--.

In Col. 3, line 28 (approximately), please change "Table I" to --Table 1--.

In Col. 3, line 36 (approximately), please change "materals" to --materials--.

In Col. 3, line 63, please change "modem" to --modern--.

In Col. 7, line 38, please change "CTE'S," TO --CTE's,--.

In Col. 8, line 17, Claim 1, please change "$5 \times 10^{-6} K^{1}$" to --$5 \times 10^{-6} K^{-1}$--.

In Col. 8, line 41, Claim 7, please change "claim 1" to --claim 1,--.

In Col. 8, line 46, Claim 9, after "of" please insert --claim--.

Signed and Sealed this

Twenty-eighth Day of September, 2010

David J. Kappos
*Director of the United States Patent and Trademark Office*